(12) United States Patent
Lin

(10) Patent No.: US 12,060,002 B2
(45) Date of Patent: Aug. 13, 2024

(54) SYSTEM AND METHOD FOR TRACKING HUMAN BEHAVIOR REAL-TIME WITH SINGLE MAGNETOMETER SENSOR AND MAGNETS

(71) Applicant: The Research Foundation for The State University of New York, Albany, NY (US)

(72) Inventor: Shan Lin, Jericho, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 195 days.

(21) Appl. No.: 17/605,068

(22) PCT Filed: Apr. 24, 2020

(86) PCT No.: PCT/US2020/029710
§ 371 (c)(1),
(2) Date: Oct. 20, 2021

(87) PCT Pub. No.: WO2020/219802
PCT Pub. Date: Oct. 29, 2020

(65) Prior Publication Data
US 2022/0185180 A1    Jun. 16, 2022

Related U.S. Application Data

(60) Provisional application No. 62/837,806, filed on Apr. 24, 2019.

(51) Int. Cl.
*B60Q 9/00*    (2006.01)
*G01R 33/02*    (2006.01)
(52) U.S. Cl.
CPC ............... *B60Q 9/00* (2013.01); *G01R 33/02* (2013.01)

(58) Field of Classification Search
None
See application file for complete search history.

(56) References Cited

U.S. PATENT DOCUMENTS 7,138,922 B2    11/2006    Strumolo et al.
8,684,922 B2    4/2014    Tran
(Continued)

FOREIGN PATENT DOCUMENTS

CN    104919396 A    9/2015
CN    105765639 A    7/2016
(Continued)

OTHER PUBLICATIONS

International Search Report dated Sep. 14, 2020 issued in PCT/US2020/029710.
(Continued)

*Primary Examiner* — Thomas S McCormack
(74) *Attorney, Agent, or Firm* — Scully, Scott, Murphy & Presser, P.C.

(57) ABSTRACT

A system and method for monitoring and analyzing activities of a person operating a machine, particularly driving a vehicle, is provided. A first magnet is attached to a hand of the person and a second magnet is attached to the head of the person. A smart watch having a magnetometer is attached to the other hand of the person. The magnetometer is in magnetic communication with both the first magnet and the second magnet to generate a first magnetic signal and a second magnetic signal. Both signals can be received by a processor and applied to mathematical models by the processor to generate indicators representative of positions and motions of the hands and the head. An alarm can be generated based on the indicators.

18 Claims, 8 Drawing Sheets

(56) References Cited

U.S. PATENT DOCUMENTS

| | | | |
|---|---|---|---|
| 8,747,336 B2 | 6/2014 | Tran | |
| 9,014,830 B2 | 4/2015 | Wohl et al. | |
| 9,028,405 B2 | 5/2015 | Tran | |
| 9,060,683 B2 | 6/2015 | Tran | |
| 9,129,460 B2 | 9/2015 | McClellan et al. | |
| 9,597,014 B2 | 3/2017 | Venkatraman et al. | |
| 9,599,632 B2 | 3/2017 | Yuen | |
| 9,691,115 B2 | 6/2017 | Abramson et al. | |
| 9,833,173 B2 | 12/2017 | Carter et al. | |
| 9,848,289 B2 | 12/2017 | Fischer et al. | |
| 9,865,176 B2 | 1/2018 | Tran | |
| 9,907,473 B2 | 3/2018 | Tran | |
| 9,993,166 B1 | 6/2018 | Johnson et al. | |
| 10,004,451 B1 | 6/2018 | Proud | |
| 10,054,465 B2 | 8/2018 | Fedtke | |
| 10,058,290 B1 | 8/2018 | Proud | |
| 10,146,323 B1 | 12/2018 | Keyes et al. | |
| 10,209,365 B2 | 2/2019 | Venkatraman et al. | |
| 10,459,103 B1 | 10/2019 | Shi et al. | |
| 10,459,611 B1 | 10/2019 | Sculley et al. | |
| 10,574,784 B2 | 2/2020 | Russell et al. | |
| 10,607,081 B2 | 3/2020 | Wexler et al. | |
| 10,610,111 B1 | 4/2020 | Tran | |
| 10,681,519 B1 | 6/2020 | Zalewski et al. | |
| 10,687,193 B2 | 6/2020 | Booth et al. | |
| 10,772,538 B1 | 9/2020 | Elhawary et al. | |
| 10,977,907 B1 | 4/2021 | Zalewski et al. | |
| 10,984,146 B2 | 4/2021 | Santarone et al. | |
| 11,017,688 B1 | 5/2021 | Arazi | |
| 11,158,179 B2 | 10/2021 | Tunnell | |
| 2007/0265533 A1 | 11/2007 | Tran | |
| 2008/0275309 A1 | 11/2008 | Stivoric et al. | |
| 2009/0177068 A1 | 7/2009 | Stivoric et al. | |
| 2010/0308999 A1 | 12/2010 | Chornenky | |
| 2011/0029359 A1 | 2/2011 | Roeding et al. | |
| 2011/0133919 A1 | 6/2011 | Evarts et al. | |
| 2012/0073892 A1 | 3/2012 | Hunter | |
| 2013/0095459 A1 | 4/2013 | Tran | |
| 2013/0311881 A1 | 11/2013 | Birnbaum et al. | |
| 2013/0325739 A1 | 12/2013 | Asay et al. | |
| 2014/0032210 A1 | 1/2014 | Baker et al. | |
| 2014/0104059 A1 | 4/2014 | Tran | |
| 2014/0245783 A1 | 9/2014 | Proud et al. | |
| 2015/0068069 A1 | 3/2015 | Tran et al. | |
| 2015/0126845 A1 | 5/2015 | Jin et al. | |
| 2015/0156567 A1 | 6/2015 | Oliver et al. | |
| 2015/0164377 A1 | 6/2015 | Nathan et al. | |
| 2015/0206409 A1 | 7/2015 | Visvanathan et al. | |
| 2015/0269825 A1 | 9/2015 | Tran | |
| 2015/0314166 A1 | 11/2015 | Hong et al. | |
| 2015/0359467 A1 | 12/2015 | Tran | |
| 2016/0019495 A1 | 1/2016 | Kolchin | |
| 2016/0165323 A1 | 6/2016 | Hollis | |
| 2016/0189507 A1 | 6/2016 | Rayner | |
| 2016/0247380 A1 | 8/2016 | Kumar | |
| 2017/0086672 A1 | 3/2017 | Tran | |
| 2017/0090568 A1 | 3/2017 | Chen et al. | |
| 2017/0160398 A1 | 6/2017 | Venkatraman et al. | |
| 2017/0188864 A1 | 7/2017 | Drury | |
| 2017/0188895 A1 | 7/2017 | Nathan | |
| 2017/0193303 A1 | 7/2017 | Wexler et al. | |
| 2017/0245806 A1 | 8/2017 | Elhawary et al. | |
| 2017/0273374 A1 | 9/2017 | Howland et al. | |
| 2018/0330423 A1 | 11/2018 | Clayton et al. | |
| 2019/0158983 A1 | 5/2019 | Fischer et al. | |
| 2019/0197861 A1 | 6/2019 | Tunnell | |
| 2019/0209022 A1 | 7/2019 | Sobol et al. | |
| 2019/0343429 A1 | 11/2019 | Elhawary et al. | |
| 2019/0380662 A1 | 12/2019 | Kwan | |
| 2019/0387998 A1 | 12/2019 | Garten et al. | |
| 2020/0146084 A1 | 5/2020 | Boushley et al. | |
| 2020/0193615 A1 | 6/2020 | Goncharov et al. | |
| 2020/0242471 A1 | 7/2020 | Busch | |
| 2020/0294374 A1 | 9/2020 | Falkenberg et al. | |
| 2020/0322703 A1 | 10/2020 | Bures et al. | |
| 2020/0383571 A1 | 12/2020 | Fakhouri et al. | |
| 2020/0409981 A1 | 12/2020 | Kadatoka et al. | |
| 2021/0034671 A1 | 2/2021 | Lemay et al. | |
| 2021/0162261 A1 | 6/2021 | Neumann | |
| 2021/0307652 A1 | 10/2021 | Lari et al. | |
| 2021/0319894 A1 | 10/2021 | Sobol et al. | |

FOREIGN PATENT DOCUMENTS

| | | |
|---|---|---|
| CN | 107444267 A | 12/2017 |
| CN | 104207755 B | 6/2018 |
| CN | 104287703 B | 6/2018 |
| CN | 108133742 A | 6/2018 |
| CN | 106215405 B | 7/2018 |
| CN | 108492528 A | 9/2018 |
| CN | 109190468 A | 1/2019 |
| CN | 109305039 A | 2/2019 |
| CN | 109493568 A | 3/2019 |
| CN | 106333667 B | 7/2019 |
| CN | 105433949 B | 6/2020 |
| EP | 3283950 A2 | 2/2018 |
| EP | 3427484 A1 | 1/2019 |
| EP | 3455838 A1 | 3/2019 |
| EP | 3659496 A1 | 6/2020 |
| EP | 3792717 A1 | 3/2021 |
| EP | 3082115 B1 | 6/2021 |
| EP | 3868128 A2 | 8/2021 |
| JP | 2015-505694 A | 2/2015 |
| JP | 6929309 B2 | 9/2021 |
| KR | 20050062773 A | 6/2005 |
| KR | 20180133526 A | 12/2018 |
| KR | 20190075988 A | 7/2019 |
| KR | 20200026798 A | 3/2020 |
| KR | 20210046085 A | 4/2021 |
| WO | 2004032715 A2 | 4/2004 |
| WO | 2008127316 A1 | 10/2008 |
| WO | 2014137915 A1 | 9/2014 |
| WO | 2015157487 A1 | 10/2015 |
| WO | 2017112778 A1 | 6/2017 |
| WO | 2017197308 A1 | 11/2017 |
| WO | 2018037074 A1 | 3/2018 |
| WO | 2018178444 A1 | 10/2018 |
| WO | 2018201121 A1 | 11/2018 |
| WO | 2020028157 A1 | 2/2020 |
| WO | 2020167424 A1 | 8/2020 |
| WO | 2020219802 A1 | 10/2020 |

OTHER PUBLICATIONS

Huang, Hua et al., "MagTrack: Enabling Safe Driving Monitoring with Wearable Magnetics", MobiSys '19, Jun. 17-21, 2019, Seoul, Korea, pp. 326-339. Retrieved on Jun. 17, 2020. Retrieved from <URL: https://dl.acm.org/doi/pdf/10.1145/3307334.3326107> entire document.

Cheng, C. et al., "Towards a Magnetic Localization System for 3-D Tracking of Tongue Movements in Speech-Language Therapy", Conf Proc IEEE Eng Med Biol Soc., 2009, pp. 563-566.

Stathopoulos, E. et al., "Magnetic pill tracking: a novel non-invasive tool for investigation of human digestive motility", Neurogastroenterol Motil, 2005, pp. 148-154, vol. 17.

Han, X. et al., "Wearable handwriting input device using magnetic field 2nd report: Influence of misalignment of magnet and writing plane", Precision Engineering, 2010, pp. 425-430, vol. 34.

Awolusi, I. et al., "Wearable technology for personalized construction safety monitoring and trending: Review of applicable devices", Automation in Construction, 2018, pp. 96-106, vol. 85.

Chen, K. et al., "uTrack: 3D Input Using Two Magnetic Sensors", Sensing, 2013, pp. 237-244.

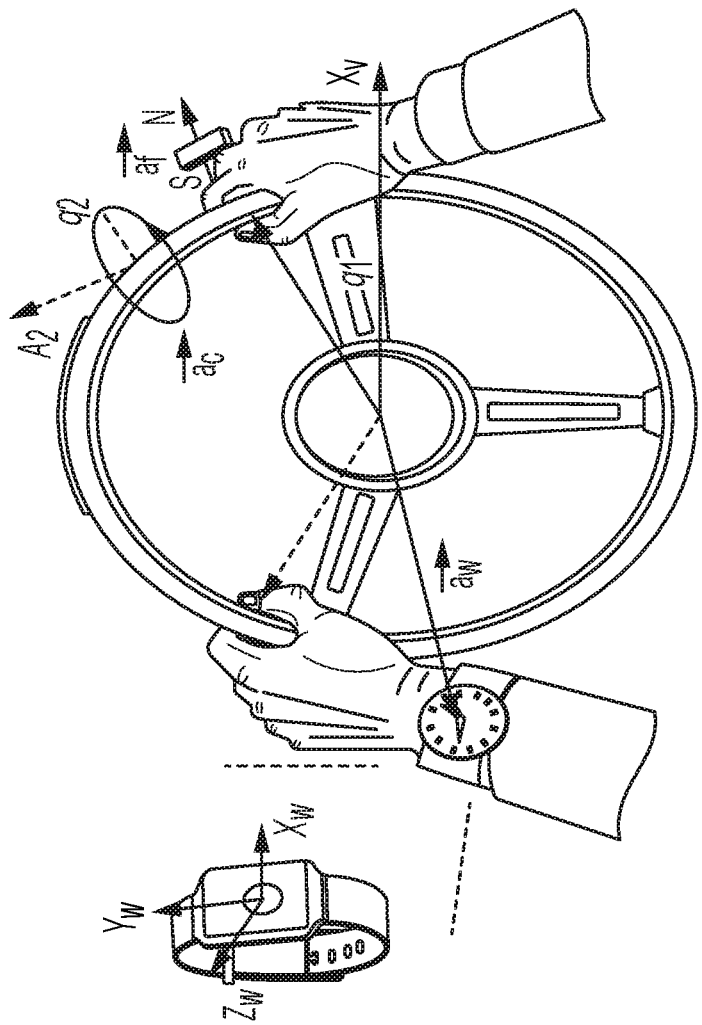
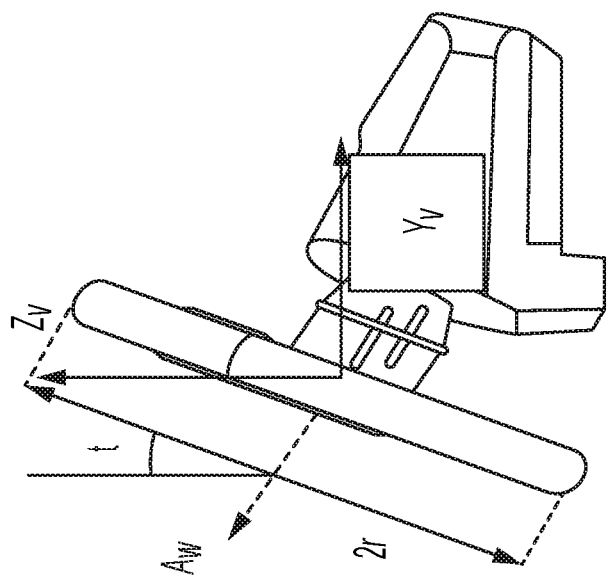
FIG. 4B
FIG. 4A

SYSTEM AND METHOD FOR TRACKING HUMAN BEHAVIOR REAL-TIME WITH SINGLE MAGNETOMETER SENSOR AND MAGNETS

CROSS REFERENCE TO RELATED APPLICATION

This application claims the benefits of U.S. Provisional Patent Application Ser. No. 62/837,806, filed Apr. 24, 2019, the entire contents and disclosure of which are hereby incorporated herein by reference.

BACKGROUND

This disclosure generally relates to human behavior (activity, movement, gesture and the like) tracking, recognition and analysis. More specifically, this disclosure relates to a method and system for tracking, recognizing and analyzing driving behaviors and selectively modifying driving behaviors to avoid potential traffic accidents.

Traffic accidents cause fatalities and injuries on daily basis in the U.S. Survey indicates that majority of the traffic accidents are caused by human errors. Common dangerous human driving activities include manual distraction (such as, eating or texting by either hand while driving, one hand off the wheel), visual distractions (such as, when the driver takes vision off the road to focus on roadside objects), drowsy driving (such as, jerky hand movements and nodding off), and unsafe lane changing/turning (such as, failure to check blind spot).

Thus, "hands on the wheel, eyes on the road" has been implemented as the central guideline of safe vehicle driving practice. To assist compliance of this guideline, different driver assistance systems have been developed.

Certain driver assistance systems can warn drivers on impending collisions, lane deviations, and aggressive steering, by detecting abnormal vehicle motions. However, these systems cannot provide sufficient time for the drivers to respond to complex road situations, particularly when the drivers are distracted. Thus, these systems are not capable of monitoring the drivers' compliance of the guideline and alerting the drivers real-time.

Furthermore, there are vision-based driver distraction monitoring systems, which rely on cameras in high-end vehicles to detect visual distractions and drowsy driving behaviors. However, the performances of these systems are heavily constrained by visibility requirements. Abnormal hand movements, including manual distractions or aggressive steering, cannot be effectively monitored.

Moreover, wearable technologies have been developed to monitor driving activity. For example, inertial measurement units (IMUs), which are commonly provided in smart watches, have been used to detect erratic steering wheel movements and manual distractions. However, these solutions based on wearable technologies are normally limited to only one hand where the watch is worn.

Therefore, it is desirable to develop reliable, robust, and low-cost technologies to monitor, in real time, various human activities, such as, driving activities.

SUMMARY OF THE INVENTION

According to an aspect of the present disclosure, a system for monitoring and analyzing activities of a person operating a machine is provided. The system includes a first device having a first magnet. The first device is attached to a first body part of the person. The system further includes a second device attached to a second body part of the person. The second device has a magnetometer in magnetic communication with the first magnet to generate a first signal. The system further includes a hardware process configured to: receive the first signal; apply the first signal to a first predetermined mathematical model to generate a first indicator representative of a movement or a position of the first body part; compare the first indicator with a first database having a plurality of entries, wherein the plurality of entries of the first database are created by machine learning based on predetermined movements or positions of the first body part; determine whether the first indicator matches at least one entry of the first database; and based on a determination that the first indicator matches no entry of the first database, generate a first alarm signal.

According to an embodiment, the system further includes a third device having a second magnet. The third device is attached to a third body part of the person. The second device is in magnetic communication with the second magnet to generate a second signal. The hardware process is further configured to: receive the second signal; apply the second signal to a second predetermined mathematical model to generate a second indicator representative of a movement or position of the third body part; compare the second indicator with a second database having a plurality of entries, wherein the plurality of entries of the second database are created by machine learning based on predetermined movements or positions of the third body part; determine whether the second indicator matches at least one entry of the second database; and based on a determination that the second indicator matches no entry of the second database, generate a second alarm signal.

According to an embodiment, the first body part is a first hand of the person and the first device is attached to the first hand of the person. The first device is selected from a group consisting of a button, a ring, a glove and a wrist band. The second body part is a second hand the person. The second device includes a smart watch attached to the second hand of the person. The third body part is the head of the person. The third device is attached to the head of the person. The third device is selected from a group consisting of a pair of eyeglasses, a head band, an earphone, an ear clip and a hat.

According to an embodiment, the machine includes a vehicle having a steering wheel operated by both the first hand and the second hand of the person. The plurality of entries of the first database are created by machine learning based on historical movements and positions of the first hand of the person when the vehicle is being operated by the person. The plurality of entries of the second database are created by machine learning based on historical movements and positions of the head of the person when the vehicle is being operated by the person.

According to an embodiment, the first predetermined mathematical model includes a position detection model using one or more Kalman filters for tracking positions of the first hand. The first predetermined mathematical model further includes a motion detection model using one or more Kalman filters for tracking movements of the first hand. The movements of the first hand are constrained within a circle defined by the steering wheel of the vehicle.

According to an embodiment, the second predetermined mathematical model includes a motion detection model using one or more Kalman filters for tracking movements of the head.

According to an embodiment, the movements of the head tracked by the motion detection model include left-turning, right-turning and nodding.

According to an embodiment, the first predetermined mathematical model and the second predetermined mathematical model are integrated to track the positions of the first hand, the movements of the first hand, and the movements of the head simultaneously.

According to an aspect of the present disclosure, a method for monitoring and analyzing activities of a person operating a machine is provided. A first device including a first magnet is attached to a first body part of the person and a second device is attached to a second body part of the person. The second device includes a magnetometer in magnetic communication with the first magnet to generate a first signal. The method includes: receiving the first signal; applying the first signal to a first predetermined mathematical model to generate a first indicator representative of a movement or a position of the first body part; comparing the first indicator with a first database having a plurality of entries, wherein the plurality of entries of the first database are created by machine learning based on predetermined movements or positions of the first body part; determining whether the first indicator matches at least one entry of the first database; and based on a determination that the first indicator matches no entry of the first database, generating a first alarm signal.

According to an embodiment, a third device having a second magnet is attached to a third body part of the person, and the magnetometer of the second device is in magnetic communication with the second magnet to generate a second signal. The method further includes: receiving the second signal; applying the second signal to a second predetermined mathematical model to generate a second indicator representative of a movement or position of the third body part; comparing the second indicator with a second database having a plurality of entries, wherein the plurality of entries of the second database are created by machine learning based on predetermined movements or positions of the third body part; determining whether the second indicator matches at least one entry of the second database; and based on a determination that the second indicator matches no entry of the second database, generating a second alarm signal.

According to an embodiment, the first body part is a first hand of the person and the first device is attached to the first hand of the person. The first device is selected from a group consisting of a button, a ring, a glove and a wrist band. The second body part is a second hand the person and the second device comprises a smart watch attached to the second hand of the person. The third body part is the head of the person and the third device is attached to the head of the person, wherein the third device is selected from a group consisting of a pair of eyeglasses, a head band, an earphone, an ear clip and a hat.

According to an embodiment, the machine includes a vehicle having a steering wheel operated by both the first hand and the second hand of the person. The plurality of entries of the first database are created by machine learning based on historical movements and positions of the first hand of the person when the vehicle is being operated by the person. The plurality of entries of the second database are created by machine learning based on historical movements and positions of the head of the person when the vehicle is being operated by the person.

According to an embodiment, the first predetermined mathematical model includes: a position detection model using one or more Kalman filters for tracking positions of the first hand; and a motion detection model using one or more Kalman filters for tracking movements of the first hand. The movements of the first hand are constrained within a circle defined by the steering wheel of the vehicle.

According to an embodiment, the second predetermined mathematical model includes a motion detection model using one or more Kalman filters for tracking movements of the head.

According to an embodiment, the movements of the head tracked by the motion detection model includes left-turning, right-turning and nodding.

According to an embodiment, the first predetermined mathematical model and the second predetermined mathematical model are integrated to track the positions of the first hand, the movements of the first hand, and the movements of the head simultaneously.

According to an aspect of the present disclosure, a computer program product for use with a computer is provided. The computer program product includes a computer readable storage medium having recorded thereon a computer-executable program for causing the computer to perform a process of monitoring and analyzing activities of a person operating a machine. A first device comprising a first magnet is attached to a first body part of the person. A second device is attached to a second body part of the person. The second device includes a magnetometer in magnetic communication with the first magnet to generate a first signal. The process includes: receiving the first signal; applying the first signal to a first predetermined mathematical model to generate a first indicator representative of a movement or a position of the first body part; comparing the first indicator with a first database having a plurality of entries, wherein the plurality of entries of the first database are created by machine learning based on predetermined movements or positions of the first body part; determining whether the first indicator matches at least one entry of the first database; and based on a determination that the first indicator matches no entry of the first database, generating a first alarm signal.

According to an embodiment, a third device having a second magnet is attached to a third body part of the person, and the magnetometer of the second device is in magnetic communication with the second magnet to generate a second signal. The process further includes: receiving the second signal; applying the second signal to a second predetermined mathematical model to generate a second indicator representative of a movement or position of the third body part; comparing the second indicator with a second database having a plurality of entries, wherein the plurality of entries of the second database are created by machine learning based on predetermined movements or positions of the third body part; determining whether the second indicator matches at least one entry of the second database; and based on a determination that the second indicator matches no entry of the second database, generating a second alarm signal.

BRIEF DESCRIPTION OF THE SEVERAL VIEWS OF THE DRAWINGS

FIG. 4 is a schematic diagram showing a steering motion modeling.

DETAILED DESCRIPTION

Detailed embodiments of the system and method of the present disclosure are described herein; however, it is to be understood that the disclosed embodiments are merely illustrative of the disclosed systems and methods that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Figure 1:
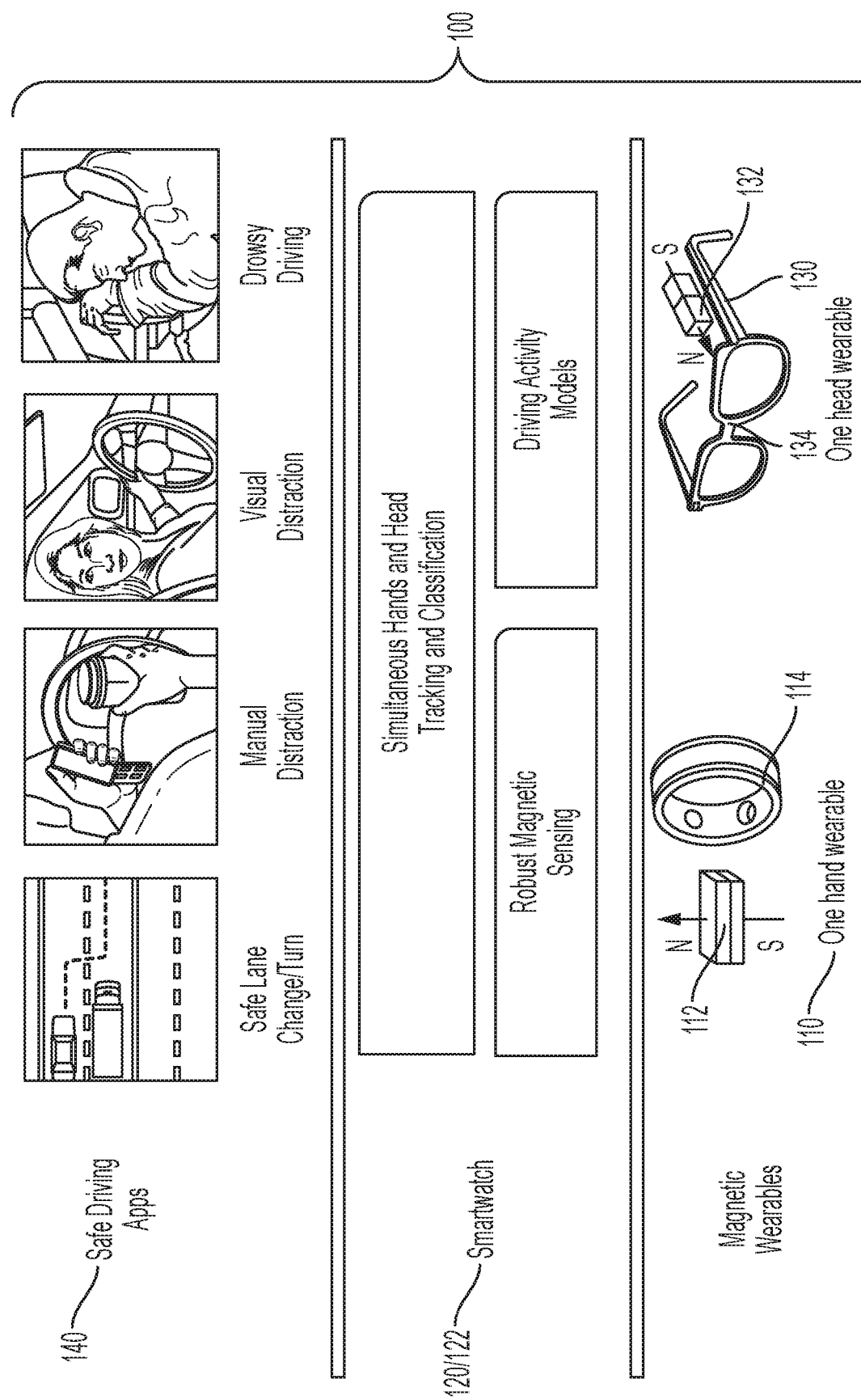
FIG. 1 is a schematic diagram showing a system for monitoring and analyzing activities of a person operating a machine.

FIG. 1 is a block diagram showing a system 100 on which, or with which, embodiments of the present disclosure can be implemented. The system 100 is capable of monitoring and analyzing activities of a person operating a machine. In the shown embodiments, the person is a driver and the machine is a vehicle. However, the system is not limited to monitoring and analyzing driving activities of a person. For example, the system can be equally applied to monitor and analyze exercising activities of a person in an effort to ensure that moving trajectories of a predetermined body part of the person during exercise comply with guidelines.

The system 100 includes a first device 110 attached to a first body part of the person. In the shown embodiment, the first device 110 is attached to the right hand of the driver. The first device 110 includes a first magnet 112 and a support 114. The first magnet 112 is mounted to the support 114 to provide a wearable device, which can be worn by the driver to allow the first device 110 to be attached to the right hand of the driver. The support can be in the form of a ring, a button, a glove or a wrist band, as long as the driver can readily wear the first device 110 having the magnet 112. The first magnet 112 can be any battery-free off-the-shelf magnet.

The system 100 includes a second device 120 attached to a second body part of the person. In the shown embodiment, the second device 120 is attached to the left hand of the driver. The second device 120 can be a wearable electronic device, such as, a smart watch. The second device 120 includes a magnetometer 122, which can be embedded into the second device 120. For example, the magnetometer 122 can be the magnetometer of the smart watch used for proving a compass function of the smart watch. It should be understood that the first device 110 can be attached to the left hand of the person and the second device 120 can be attached to the right hand of the person, without departing from the spirit of the disclosure. The magnetometer 122 is in magnetic communication with the first magnet 112 to generate one or more first signals based on the magnetic field of the first magnet 112 detected by the magnetometer 122. These signals can be processed to provide position and motion information related to the driver's posture and motion.

The system 100 includes a third device 130 attached to a third body part of the person. In the shown embodiment, the third device 130 is attached to the head of the driver. The third device 130 includes a second magnet 132 and a support 134. The second magnet 132 is mounted to the support 134 to provide a wearable device, which can be worn by the driver to allow the third device 130 to be attached to the head of the driver. The support can be in the form of a head band, a pair of eyeglasses, an earphone, an ear clip or a hat, as long as the driver can readily wear the third device 130 having the magnet 132. The magnetometer 122 of the second device 120 is also in magnetic communication with the second magnet 132 to generate one or more second signals based on the magnetic field of the second magnet 132 detected by the magnetometer 122. These signals can be processed to provide position and motion information related to the driver's posture and motion.

The system 100 includes a hardware processor 140 that can be a processing unit or computer and may be controlled primarily by computer readable instructions, which may be in the form of software. For example, the hardware processor 140 can be embedded into the second device 120 in the form of a smart watch; alternatively, the hardware processor 140 can be the processor of a smart phone used by the person. The hardware processor 140 can be configured, adapted or programmed to implement certain calculations and/or functions, by executing the computer readable instructions.

In the shown embodiment, the hardware processor 140 is configured to receive the first signals from the magnetometer 122 and apply the first signals to a first predetermined mathematical model to generate a first indicator representative of movements or positions of the right hand of the person and/or the left hand of the person. The hardware processor 140 is further configured to compare the first indicator with a first database having a plurality of entries. The plurality of entries of the first database are created by machine learning based on predetermined movements or positions of the right hand and/or the left hand of the person. The hardware processor 140 is further configured to determine whether the first indicator matches at least one entry of the first database. The hardware processor 140 is further configured to generate a first alarm signal, based on a determination that the first indicator does not match any entry of the first database. The plurality of entries of the first database are created by machine learning based on historical movements and positions of the right hand and/or the left hand of the person when the vehicle is being operated by the person. For example, these entries can be created by extrapolating proper movements and/or positions of the right hand and/or left hand of the person when the driving behaviors of the person conform to the safe driving guidelines. The first predetermined mathematical model can include a position detection model using one or more Kalman filters (or any algorithm thereof) for tracking positions of the right hand and/or left hand of the person. The first predetermined mathematical model can also include a motion detection model using one or more Kalman filters (or any algorithm thereof) for tracking movements of the right hand and/or the left hand. The movements of the right hand and/or the left hand are generally constrained within a circle defined by a steering wheel of the vehicle.

The hardware processor 140 is configured to receive the second signals from the magnetometer 122 and apply the second signals to a second predetermined mathematical model to generate a second indicator representative of movements or positions of the head of the person. The hardware processor 140 is further configured to compare the second indicator with a second database having a plurality of entries. The plurality of entries of the second database are created by machine learning based on predetermined movements or positions of the head of the person. The hardware processor 140 is further configured to determine whether the second indicator matches at least one entry of the second database. The hardware processor 140 is further configured to generate a second alarm signal, based on a determination that the second indicator does not match any entry of the second database. The plurality of entries of the second database are created by machine learning based on historical movements and positions of the head of the person when the vehicle is being operated by the person. For example, these entries can be created by extrapolating proper movements and/or positions of the head of the person when the driving behaviors of the person conform to the safe driving guidelines. The second predetermined mathematical model can include a motion detection model using one or more Kalman filters (or any algorithm thereof) for tracking movements of the head of the person. The movements of the head, tracked by the motion detection model, include left-turning, right-turning and nodding.

The first predetermined mathematical model and the second predetermined mathematical model can be integrated into a comprehensive mathematical model to simultaneously and concurrently track the positions of the right hand and/or the left hand, the movements of the right hand and/or the left hand, and the movements of the head.

The system 100, as described above, is capable of recognizing different driving activities, and detecting violations against safe driving guidelines based on the tracked positions and motions of the driver's head and hands and if necessary, will issue warnings to the driver. The mathematical models and databases can be configured based on the driver's driving habits (which include driving posture and the like) and other factors (such as, traffic and road conditions).

Figure 2:
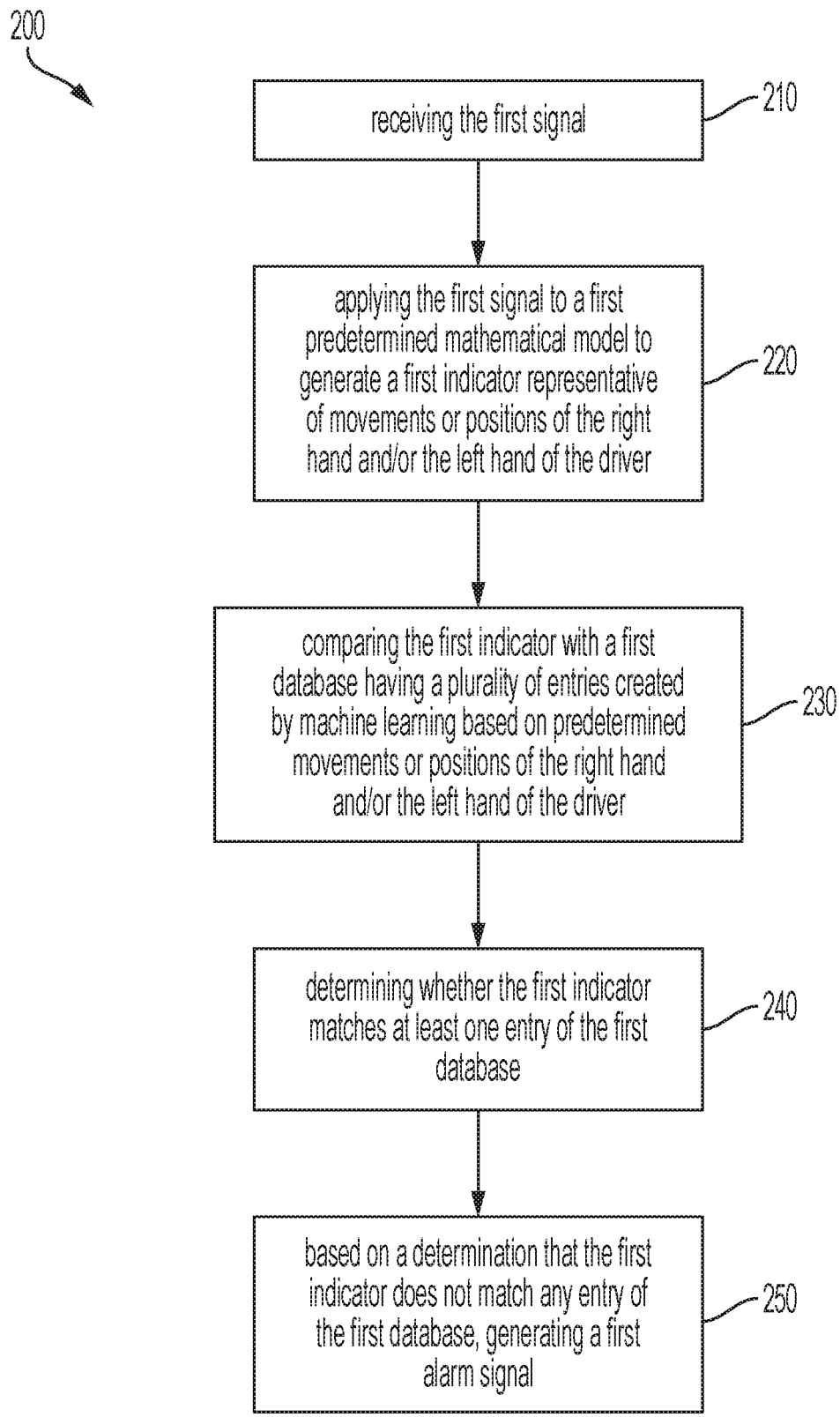
FIGS. 2 and 3 are flow charts showing a method for monitoring and analyzing activities of a person operating a machine.
Figure 3:
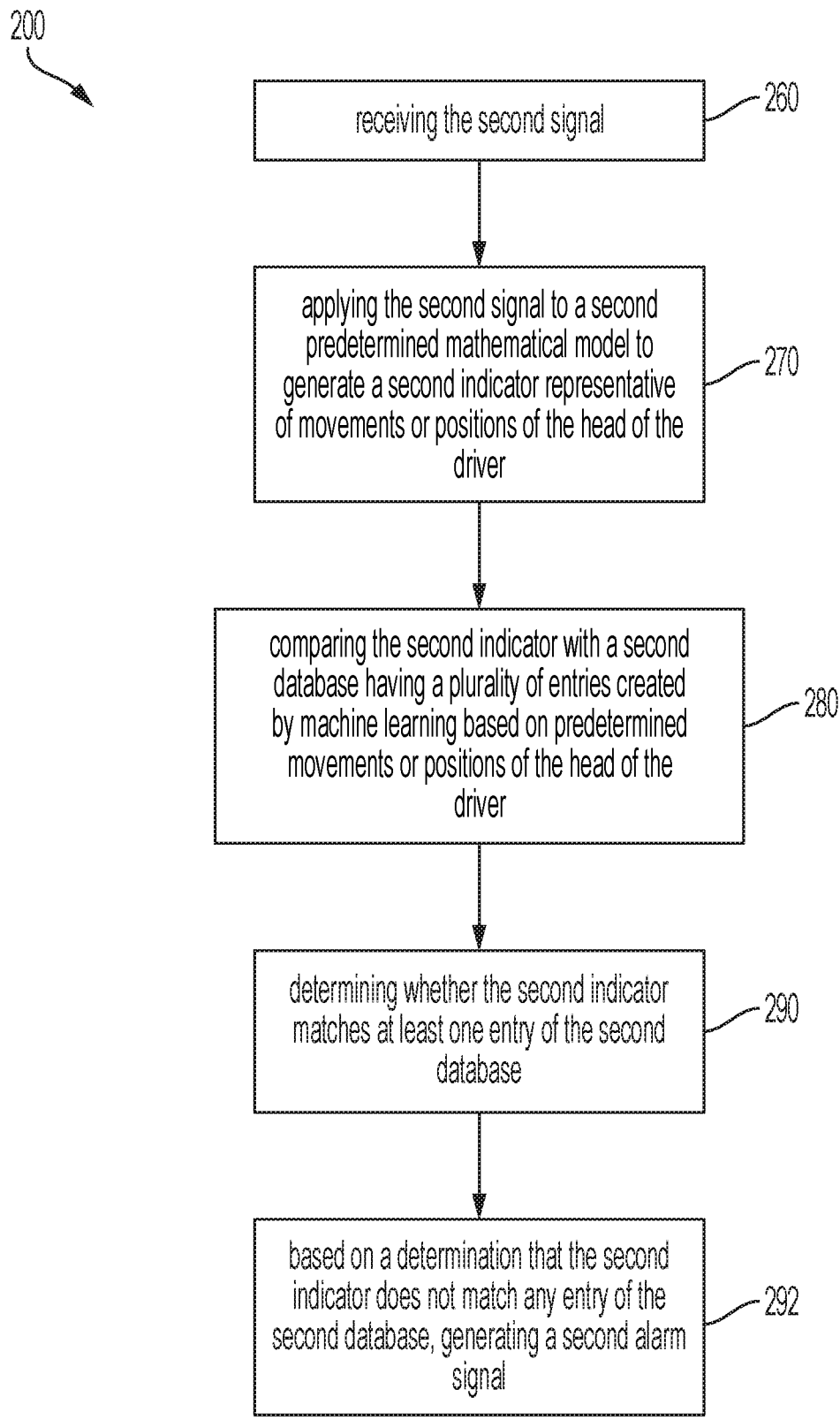

Another aspect of the present disclosure is directed to a method for monitoring and analyzing activities of a person operating a machine. FIGS. 2 and 3 are flowcharts showing a method 200 according to an embodiment of the present disclosures. The method 200 is capable of monitoring and analyzing activities of a person operating a machine. In the shown embodiments, the person is a driver and the machine is a vehicle. However, the method is not limited to monitoring and analyzing driving activities of a person. For example, the method can be equally applied to monitor and analyze exercising activities of a person in an effort to ensure that moving trajectories of a predetermined body part of the person during exercise comply with guidelines.

The method 200 will be described with respect to the system 100 described previously. As shown in FIG. 2, the method 200 includes step 210, in which the first signals generated by the magnetometer 122 are received by the processor 140. At step 220, the first signals are applied by the processor 140 to a first predetermined mathematical model to generate a first indicator representative of movements or positions of the right hand and/or the left hand of the driver. At step 230, the first indicator is compared by the processor 140 with a first database having a plurality of entries created by machine learning based on predetermined movements or positions of the right hand and/or the left hand of the driver. At step 240, it is determined by the processor 140 whether the first indicator matches at least one entry of the first database. At step 250, the processor 140 generates a first alarm signal, based on a determination that the first indicator does not match any entry of the first database.

At step 260, the processor 140 receives second signals generated by the magnetometer 122. At step 270, the second signals are applied by the processor 140 to a second predetermined mathematical model to generate a second indicator representative of movements or positions of the head of the driver. At step 280, the second indicator is compared by the processor 140 with a second database having a plurality of entries created by machine learning based on predetermined movements or positions of the head of the driver. At step 290, the processor 140 determines whether the second indicator matches at least one entry of the second database. At step 292, the processor 140 generates a second alarm based on a determination that the second indicator does not match any entry of the second database.

When the driver is operating the vehicle, both hands of the driver are holding the steering wheel. Thus, the motions and positions of both hands are constrained within a circle defined by the steering wheel of the vehicle. Similarly, the hands of the driver can also be constrained by the configuration of the seat of the vehicle. The first mathematical model, the second mathematic model and the comprehensive mathematical model are configured to firstly identify the motion types of the hands and/or head of the driver, and subsequently, track the motions of the driver.

Each of the first mathematical model, the second mathematic model and the comprehensive mathematical model includes or consists of a bank of parallel running Kalman filters. For example, the first mathematical model can include one Kalman filter for tracking motions of the right hand and/or the left hand. For example, the second mathematical model can include three separate Kalman filters, which are used to track left-turning, right-turning and nodding (up-down motions) of the head, respectively. For example, multiple separate Kalman filters can be used to detect concurrent hand and head motions.

Each Kalman filter, represented by $KF^c$ (c represents motion type), is defined by a state transition model (which describes how the object moves over time) and a measurement model (which describes the relation between the object and the sensor measurements). After KF is defined, the Kalman filtering algorithm is used to estimate the values of the state variables.

In the development of a sensing model $H^c(\cdot)$, the 3D rotation operations of vectors are used extensively. The 3D rotation around an axis A for angle $\beta$ can be represented using a matrix $R(A, \beta)$, which is shown in following Equation 1:

$$R(A, \beta) = \begin{bmatrix} tu_x^2 + C & tu_xu_y - Su_z & tu_xu_z + Su_y \\ tu_xu_y + Su_z & tu_y^2 + C & tu_yu_z - Su_x \\ tu_xu_z - Su_y & tu_yu_z - Su_x & tu_z^2 + C \end{bmatrix} \quad (1)$$

where $A = [u_x, u_y, u_z]^T, C = \cos(\beta), S = \sin(\beta), t = 1 - C.$

FIG. 4 is a schematic diagram showing a steering motion modeling. As shown in the figure, the driver is holding the steering wheel with both hands. The variable $\theta_1$ and $\theta_2$ are used to describe the holding position and posture. When $\theta_1=0$, the driver's right hand is holding the 3 o'clock position of the steering wheel. When $\theta_2=0$, the north pole direction of the magnetic tag (i.e., the first magnet 112) lies on the steering wheel plain and points to the centrifugal direction. Furthermore, the change rates $\dot{\theta}_1$ and $\dot{\theta}_2$ are also included into the state variables. The benefit is that the tracker will have quicker responses to the system variable changes. By definition, $\theta_i(k)=\theta_i(k-1)+\Delta T*\dot{\theta}_i(k-1)$ for i=1, 2 and $\Delta T$ to be the time interval between two samples. Writing into matrix form, the state variable vector $X^s(k)$ and state transition matrix $F_s$ are defined in following Equations 2:

$$X^s(k) = \begin{bmatrix} \theta_1(k) \\ \dot{\theta}_1(k) \\ \theta_2(k) \\ \dot{\theta}_2(k) \end{bmatrix}, F^s = \begin{bmatrix} 1 & \Delta T & 0 & 0 \\ 0 & 1 & 0 & 0 \\ 0 & 0 & 1 & \Delta T \\ 0 & 0 & 0 & 1 \end{bmatrix}. \quad (2)$$

The measurement model for hand steering motions is constructed as follows. The purpose is to obtain the sensing model describing the analytical relation between the hand holding positions ($\theta_1$, $\theta_2$) and the magnetic field measurements on the smart watch 120 attached to the left hand of the driver. The magnetic field of the hand magnetic tag is determined by its position relative to the sensor ($\vec{a}_t$) and magnetic moment $\vec{m}$, which is a vector describing the dipole strength and direction. These two quantities can be analyzed one by one. As shown in FIG. 4, r is used to denote the radius of the steering wheel, and t the tilt angle of the steering wheel. The vehicle coordinate frame $X_v$-$Y_v$-$Z_v$ is defined as follows: $Z_v$ is pointing vertically up; $Y_v$ is pointing horizontally front; $X_v$ is perpendicular to the surface $Y_v$-$Z_v$ and pointing right.

The position from the first magnet 112 to the magnetometer 122 of the smart watch 120 sensor, denoted by $\vec{a}_t$, can be decomposed into three components, as shown in following Equation 3:

$$\vec{a}_t = \vec{a}_w - \vec{a}_c(\theta_1) - \vec{a}_f(\theta_1, \theta_2). \quad (3)$$

In this equation, $\vec{a}_c$ is the vector from the center of the steering wheel to the edge of the steering wheel; $\vec{a}_f$ is the vector from the edge of the steering wheel to the magnet. $\vec{a}_c$ and $\vec{a}_f$ are illustrated in FIG. 4. $\vec{a}_w$, as shown in FIG. 4, is defined as a vector from the center of the steering wheel to the magnetometer 122 when the driver is holding the steering wheel. The position of the watch depends on the driver's hand holding position and holding habit. An estimation of $\vec{a}_w$ can be obtained during a calibration process. In this embodiment, the case when the driver is holding the steering wheel without moving actively is considered.

The vector $\vec{a}_c$ can be determined by the holding position $\theta_1$. When $\theta_1$ changes, $\vec{a}_c$ can be viewed as a vector rotating around the axis $A_W$, as shown in FIG. 4. $\vec{A}_w$ is the rotation axis of the steering wheel, which has a tilt angle t. The expression of $\vec{a}_c$ can be derived by rotating from its initial position. Specifically, $\vec{a}_c(\theta_1)=R_{Aw}(\theta_1)*r*[1,0,0]^T$, where $R_{Aw}(\theta_1)$ represents a 3D rotation around axis $A_W$ with angle $\theta_1$, as defined in above equation (1). The expressions for $\vec{A}_w$ and $\vec{a}_c(\theta_1)$ are shown in following Equation 4:

$$\vec{A}_w=[0,-\cos t,\sin t]^T$$

$$\vec{a}_c(\theta_1)=rR(A_w,\theta_1)[1,0,0]^T. \quad (4)$$

$\vec{a}_f$, shown as a vector in FIG. 4, can be analyzed. The length of $\vec{a}_f$, denoted by 1, is determined by the thickness of the driver's finger and the shape of the magnet 112. Intuitively, $\vec{a}_f$ can be viewed as a vector rotating around the axis $\vec{A}_2$ by an angle $\theta_2$. $\vec{A}_2$ is a unit vector perpendicular to both $\vec{a}_c$ and $\vec{A}_w$, so its value can be computed by using the cross product between $\vec{A}_w$ and $\vec{a}_c$. When $\theta_2=0$, $\vec{a}_f(\theta_1, 0)$ is parallel to $\vec{a}_c$, so $\vec{a}_f(\theta_1,0)=l/r* \vec{a}_c(\theta_1)$. Therefore, $\vec{a}_f$ can be computed by using following Equation 5:

$$\vec{A}_2 = \vec{A}_w \times \vec{a}_c(\theta_1) \quad (5)$$

$$\vec{a}_f(\theta_1, \theta_2) = \frac{r}{l} R(A_2, \theta_2) \vec{a}_c(\theta_1).$$

Finally, the values of $\vec{a}_c$, $\vec{a}_f$ and $\vec{a}_w$ are used to compute the magnet 112 relative position $\vec{a}_t$ by using the above equation (3).

For detecting the orientation of the magnet 112, $\vec{m}$ represents the direction of the magnet's north pole. Intuitively, it has the same direction as the vector $\vec{a}_f$ shown in FIG. 4. $\vec{m}$ can be viewed as a vector rotating around the axes $\vec{A}_w$ and $\vec{A}_2$ for angles $\theta_1$ and $\theta_2$. When $\theta_1=\theta_2=0$, $\vec{m}=[1, 0, 0]^T$. The vector A can be computed by following Equation 6:

$$\vec{m}=R(A_w,\theta_1)R(A_2,\theta_2)[1,0,0]^T. \quad (6)$$

In this equation, $R_{Aw}(\theta_1)$ and $R_{A2}(\theta_2)$ represent the 3D rotations and the rotation axes $\vec{A}_w$ and $\vec{A}_2$ can be computed from above equations (4) and (5).

Figure 5:
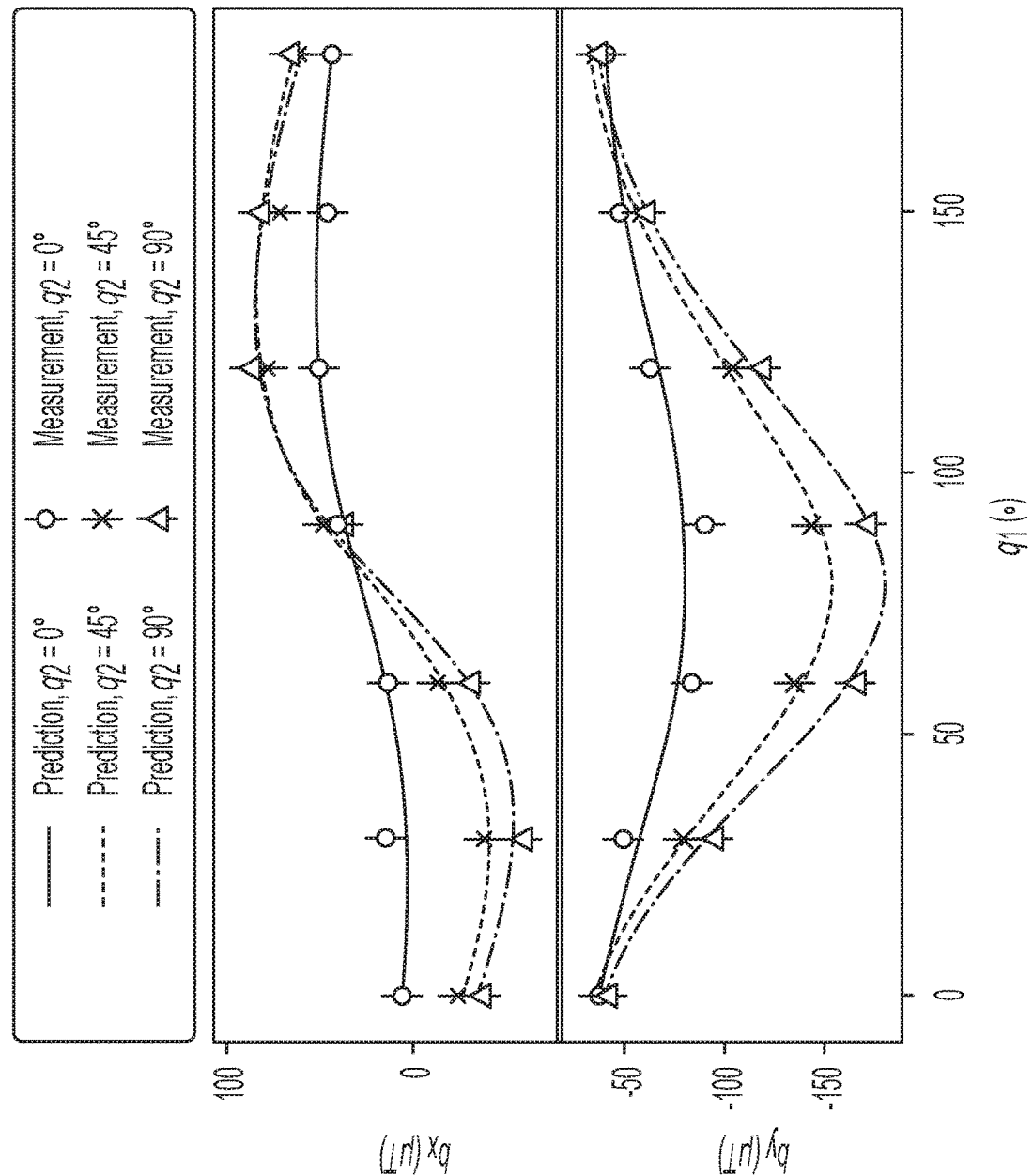
FIG. 5 is a schematic diagram showing magnetic measurements with respect to model estimations.

Based on the estimations of $\vec{a}_t$ and $\vec{m}$, described from equations (3) to (6), the magnetic field $\vec{B}$ can be analytically calculated by following Equation 7.

$$B = H^s(\theta_1, \theta_2) = \frac{\mu}{4\pi a^3}\left[\frac{3\vec{a}_t\vec{a}_t^T}{a^2} - I_3\right]\vec{m} \quad (7)$$

where $a=\|\vec{a}_t\|_2$, and $\mu$ is a constant representing the magnetic permeability of the environment. The theoretical values $\vec{B}$ and the actual measurements $\vec{b}$ are plotted in FIG. 5, when the driver is holding the different positions with different postures. The model accurately predicts sensor measurements even when holding position $\theta_1$ varies from 0° to 180° and the wrist angle $\theta_2$ varies from 0° to 90°.

After the state transition model (Equation 2) and measurement model (Equation 7) are defined, the value of the state variables, holding position $\theta_1$ and posture $\theta_2$ can be tracked, by using the Kalman filtering algorithm. Since the measurement model described in Equation 7 is nonlinear, the unscented Kalman filtering algorithm can be selected, which has low cost on computation and can handle nonlinear Kalman filtering models.

Figure 6:
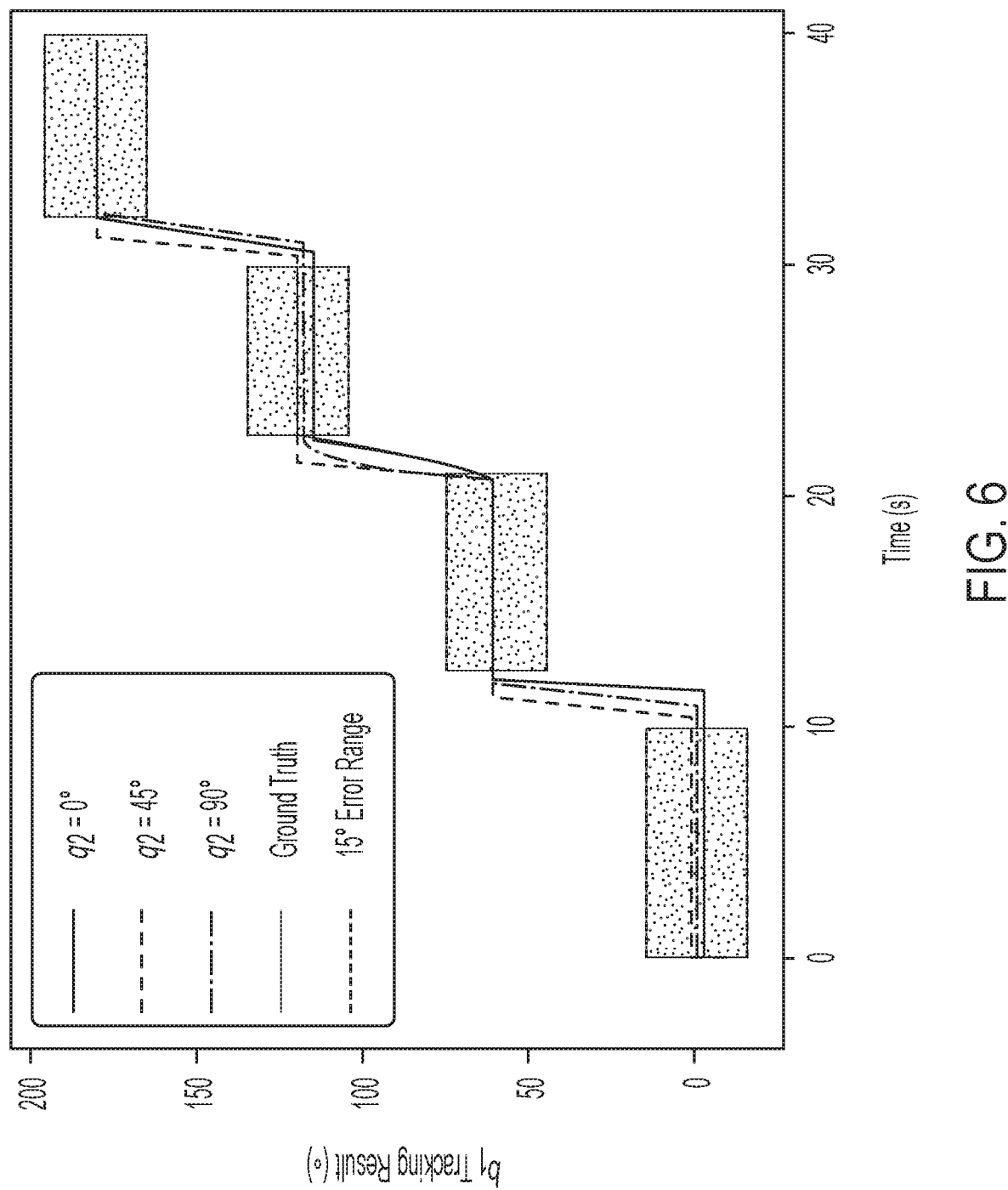
FIG. 6 is a schematic diagram showing a result of a tracking test.

The result of a tracking test is shown in FIG. 6. In this test, the driver holds the steering wheel at different positions ($\theta_1$), with different postures ($\theta_2$). In view of the test result, the algorithm of the present disclosure is able to track the hand holding position with an error smaller than 10° for most of the time.

To calibrate the system, it's necessary to obtain the quantities described in FIG. 4, including r, t, and $\vec{a}_w$. Although it is possible to directly measure these quantities, it is benefit to adopt the Maximum Likelihood Parameter Estimation (MLE) approach. The MLE can search for the parameters, such that the magnetic field computed by the sensing model closely matches the measurements. Specifically, the driver needs to hold the steering wheel with the right hand with different positions $\theta_1$ and postures $\theta_2$, and the ground truth values of $\theta_1$, $\theta_2$ are recorded together with the magnetic sensor measurements. The maximum likely parameter estimation technique can be subsequently used to obtain the estimation of the parameters.

The Kalman filtering models for head motion monitoring are described as follows. As described previously, the second magnet 132 is attached to one of the driver's head accessories, such as eyeglasses or earphone. The primary challenge is that due to the long distance from the second magnet 132, the magnetic field strengths at the magnetometer are relatively weak, causing a low signal-to-noise ratio. Thus, it is difficult to construct an analytical measurement model for the head magnetic tag. To address this challenge, the head motions are first divided into three types: left turn, right turn, and nodding. Subsequently, three Kalman filters are constructed to track the three types of motions, respectively. In this way, a linear approximate measurement model for each motion type can be constructed. As a result, the model robustness to noises can be improved, and the computation complexity can be reduced.

To estimate the head left turn angle of time k, $\gamma_l(k)$, a Kalman filtering model $KF^l$ is designed by using following Equations 8:

$$X^l(k) = \begin{bmatrix} \gamma_l(k) \\ \dot{\gamma}_l(k) \end{bmatrix}, F^l = \begin{bmatrix} 1 & \Delta T \\ 0 & 1 \end{bmatrix}, \quad (8)$$

$$\vec{B}^l(k) \approx H^l(\gamma_l(k)) = \vec{a}_0 + \vec{a}_1 \gamma_l(k).$$

$\gamma_l$ is used to represent the left head turn angle of the driver. $\gamma_l$ takes values in the interval [0°,90°] and $\gamma=0$ when the driver is facing front. To facilitate the tracking, the head angle change rate $\dot{\gamma}_l$ is included into the state variable. By definition, $\gamma_l(k)=\gamma_l(k-1)+\Delta T \dot{\gamma}_l(k-1)$. Therefore, the state transition model is shown in the first line of Equation 8.

When the driver's head turns left, the 3D magnetic field measurements $\vec{B}^l$ can be regarded as a function of the left head turn angle $\gamma_l$, i.e., $\vec{B}^l = H^l(\gamma_l)$. Instead of finding the exact expression of $H^l(\cdot)$, the linear regression is used to obtain an approximation, which is shown in the second line of Equation 8. In this equation, $\vec{a}_1$ and $\vec{a}_0$ are vectors having same dimensions as $\vec{B}^l$, which has three. The values of $\vec{a}_0$ and $\vec{a}_1$ can be estimated by using the linear regression algorithm during the calibration phase.

Figure 7:
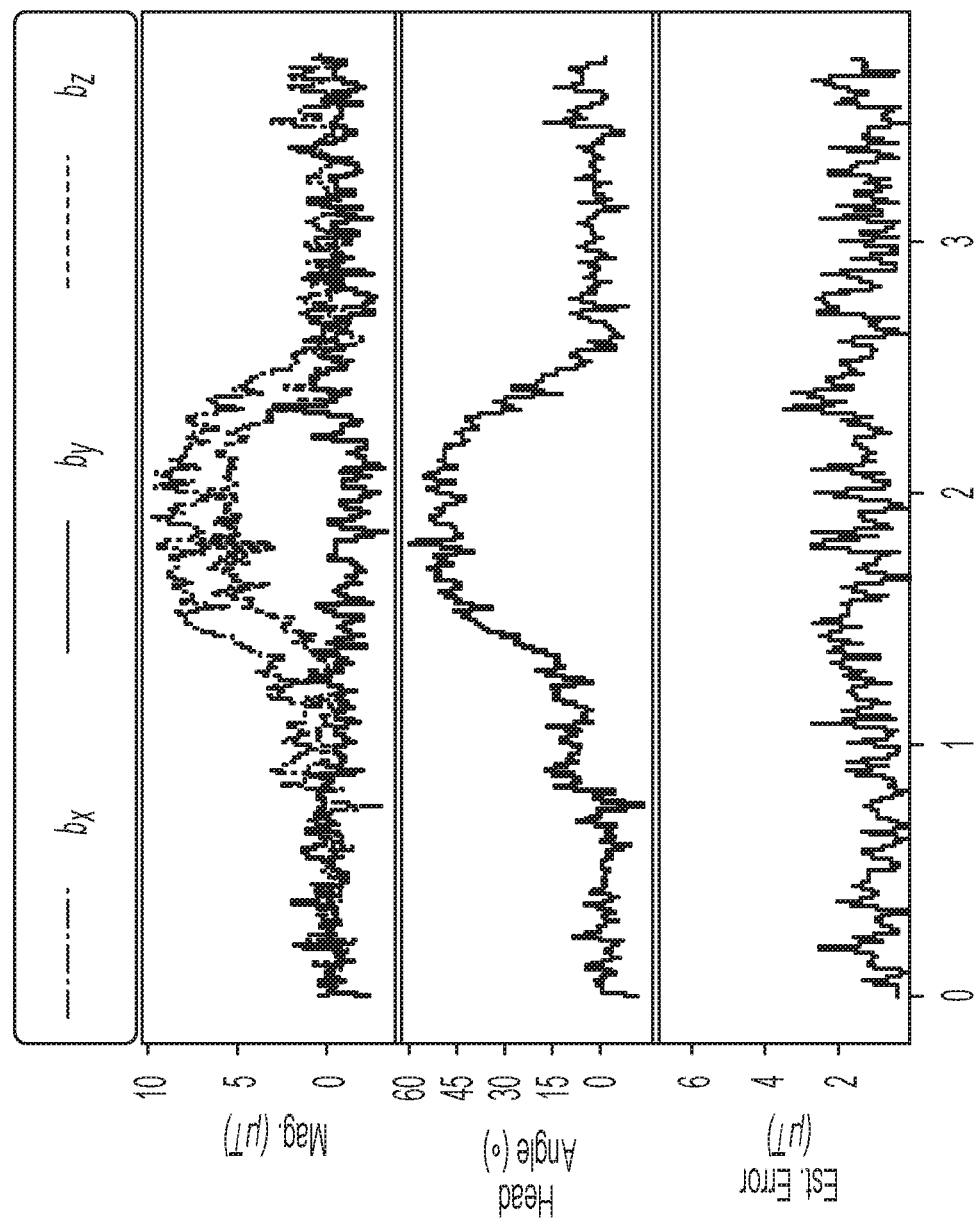
FIG. 7 is a schematic diagram showing magnetometer measurements, head angles and estimation errors for tracking a left head-turning of the person.

After the Kalman filtering model $KF^l$ is defined, the classical linear Kalman filter can be used to estimate the head left turn angle $\gamma_l(k)$. The tracking result is shown in the middle row of FIG. 7, which is a schematic diagram showing magnetometer measurements, head angle and estimation error for left head turn. To validate the measurement models $H^l(\ )$, the model estimation error can be calculated $e_k = |\vec{B}(k) - H^l(\gamma_l(k))|$. The results are shown in the third row in FIG. 7. It can be seen that the norm of the estimation error is almost always smaller than 6 µT, which is similar to the random sensor noise.

Using the same technique used to construct the left head turn Kalman filter $KF^l$, the Kalman filters for right and down turn, which are represented by $KF^r$, $KF^d$, can be constructed.

According to an embodiment of the present disclosure, a concurrent motion modeling is also provided for tracking hand motions and head motions at the same time. For example, during turning in an intersection, the driver may turn his head to check for pedestrians at the same time. Intuitively, when both magnets 112 and 132 move simultaneously, the impact on the sensor measurements is a superposition of the influence of each magnet. Separate Kalman filters are used to monitor these types of concurrent motions. In the embodiment, the detection for concurrent steering while turning head left or right is tested. The measurement model is defined as the sum of the measurement models for hand and head motions. The Kalman filter for concurrent steering and head left turn motions, $KF^{sl}$ is shown by following Equation 9:

$$X^{sl} = \{\theta_1, \theta_2, \gamma_1\}, F^{sl} = I_{3\times 3}$$

$$B^{sl} = H^{sl}(\theta_1, \theta_2, \gamma_1) = H_s(\theta_1, \theta_2) + H^l(\gamma_1) - \vec{a}_0 \quad (9)$$

where $H^s(\theta_1, \theta_2)$ and $H^l(\gamma_1)$ are the measurement models for hand steering and head turn motions defined in Equations 7 and 8, respectively. $\theta_1$ and $\gamma_1$ are defined to be larger than certain thresholds, i.e., $|\theta_1| > T_{\theta 1}$ and $|\gamma| > T_{\gamma 1}$. As a result, the tracking result of $KF^{sl}$ becomes accurate only when both magnets have large motions. On the other hand, if only one magnet is moving, the separate Kalman filters $KF^s$ or $KF^l$ can achieve better tracking accuracy.

Using the Kalman filtering models, $KF^i$, where i=s, l, r, d, sl, sr, sd, described above, the hand and head motions can be tracked in real time. Based on the tracking results of these parallel Kalman filters, the STC framework can recognize the most likely current motion type using the Bayesian rule. The STC is described in the following table Algorithm 1. The input of the algorithm is the magnetic sensor measurements within a time window, represented by $\{B(1), B(2), \ldots, B(W)\}$. The algorithm output is the most likely motion type c, and the corresponding tracking results $\{X_c(1), X_c(2), \ldots, X_c(W)\}$.

| Algorithm 1 Simultaneous Tracking and Classification |
| --- |
| Input: Magnetometer Measurement: B(k), k = 1, 2, ...., W |
| Output: Motion Type: c, Tracking Result: $X^c(k)$, k = 1, 2, ..., W |
| 1: $count_i \leftarrow 0$ for all Motion Class i |
| 2: for Time Step k = 1 : W do |
| 3:    for Motion Class i = 1 : N do |
| 4:       $\bar{X}^i \leftarrow F \cdot X^i(k-1)$ |
| 5:       $X_k^i \leftarrow \text{update}(B(k))$ |
| 6:       $\delta_k^i \leftarrow B(k) - H^i(X^i(k))$ |
| 7:       $P(B(k) \mid i) \leftarrow \frac{1}{(2\pi)^{3\sigma/2}} \exp\{-\delta^i(k)^T \delta^i(k)/(2\sigma)\}$ |
| 8:       $P(i \mid B(k)) = \frac{P(B(k) \mid i) P(i)}{\sum_{j=1}^{s} P(B(k) \mid j) P(j)}$ |
| 9:       Normalize P(i\|B(k)) |
| 10:      if P(i\|B(k)) > T then |
| 11:          $count_i$ ++ |
| 12      end if |
| 13:    end for |

| Algorithm 1 Simultaneous Tracking and Classification |
| --- |
| 14: end for |
| 15: $c \leftarrow \underset{i}{\operatorname{argmax}}(\text{count}_i)$ |
| 16: return c, $\{X^c(1), X^c(2), ..., X^c(W)\}$ |

Given the sensor measurement B(k), the algorithm iterates all the 7 parallel Kalman filters, as shown in Line 3 where N=7. Line 4 and 5 represent the prediction and update in Kalman filtering, which compute the estimation of the state variable $X^i(k)$ for the motion class i. The unscented Kalman filter is used for hand steering and the concurrent motion tracking, and the classical linear Kalman filter is used for the head turn motion monitoring. In Line 6, the post-fit measurement residue $\delta^i(k)$ is computed, which is the difference between ground-truth measurement B(k) and the post-fit measurement estimation $H(X^i(k))$. The conditional probability P(B(k)|i) is computed based on the assumption that the sensor measurements contain white noises V~N(0, $\sigma^2$), and $\sigma^2$ is the variance measurement noise. Therefore, P(B(k)|i) can be computed by using the Gaussian distribution equation described in Line 7. Subsequently, the posterior probability P(i|B(k)) can be calculated, which represents the likelihood of the motion class i given measurement B(k), using the Bayes principle described in Line 8. P(j) is the prior probability, which represents the probability of occurrence of each motion class. The probabilities are set to be 1/N. Subsequently, the probability P(i|B(k)) is normalized, so that $\Sigma_j P(f|B(k))=1$. (k))=1. A significance test is conducted by comparing P(i|B(k)) with a threshold T to ensure sufficient confidence in motion probability. Finally, the most likely motion class c within the time window W is selected, such that P(c|B(k)) has values greater than T for the most number of time steps k. The motion class c and the corresponding tracking results will be returned.

Figure 8:
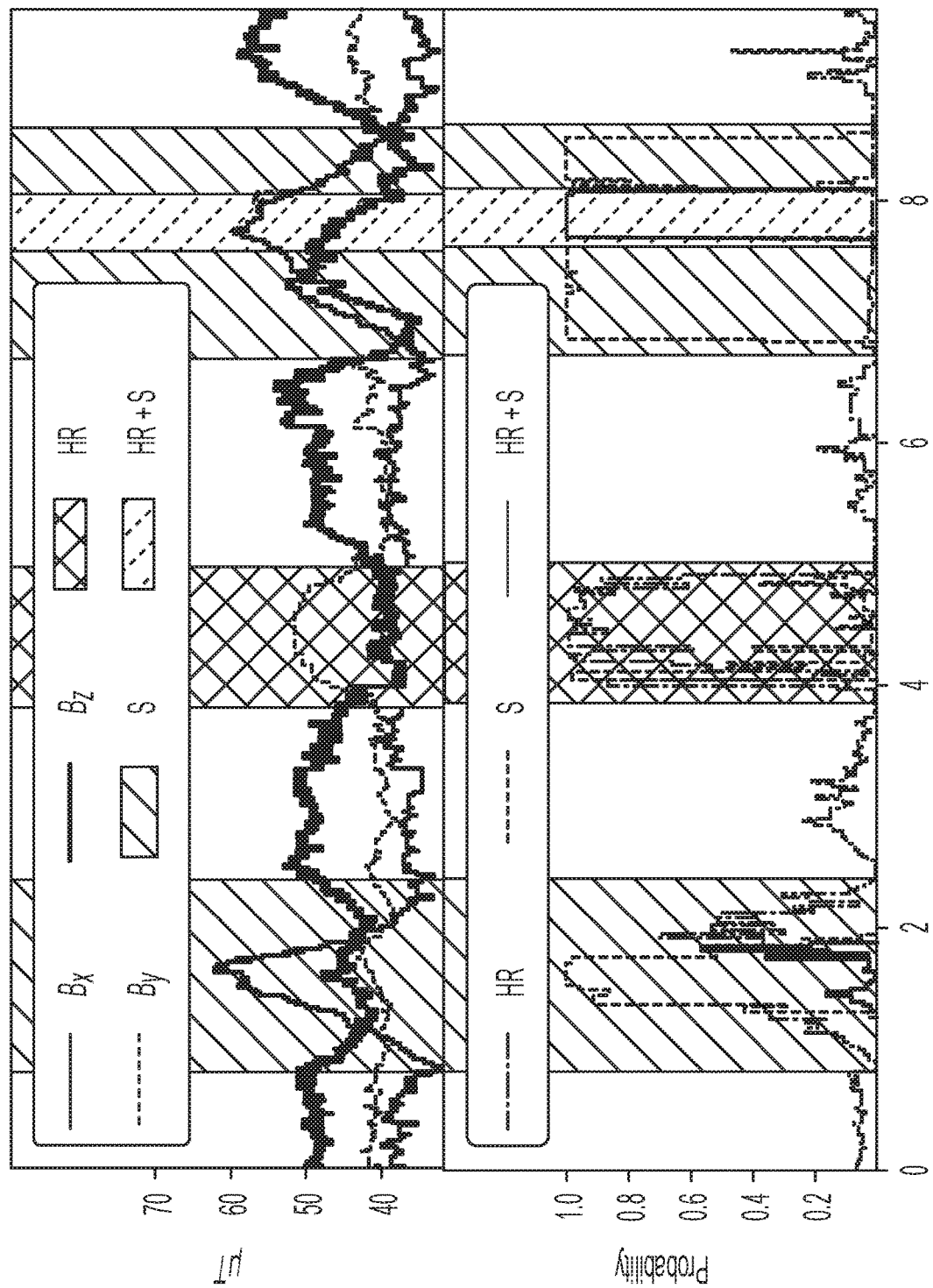
FIG. 8 is a schematic diagram showing sample motion classification results.

FIG. 8 shows sample motion classification results. Between around second 1 and 2, the driver is steering the wheel (S). Between around second 4 and 5, the driver is turning head to the right direction (HR), and between second 6 and 9, the driver is steering the car, and turns head briefly at second 8 (HR+S). It can be seen that the STC algorithm correctly recognize the correct motions for most of the time by raising the motion class likelihood to close 1.

While the invention has been shown and described with reference to certain embodiments of the present invention thereof, it will be understood by those skilled in the art that various changes in from and details may be made therein without departing from the spirit and scope of the present invention and equivalents thereof.

The invention claimed is:

1. A system for monitoring and analyzing activities of a person operating a machine, comprising:
a first device comprising a first magnet, wherein the first device is attached to a first body part of the person;
a second device attached to a second body part of the person, wherein the second device comprises a magnetometer in magnetic communication with the first magnet to generate a first signal; and
a hardware processor configured to:
receive the first signal;
apply the first signal to a first predetermined mathematical model to generate a first indicator representative of a movement or a position of the first body part;
compare the first indicator with a first database having a plurality of entries, wherein the plurality of entries of the first database are created by machine learning based on predetermined movements or positions of the first body part;
determine whether the first indicator matches at least one entry of the first database; and
based on a determination that the first indicator matches no entry of the first database, generate a first alarm signal.

2. The system according to claim 1,
further comprising a third device comprising a second magnet, wherein the third device is attached to a third body part of the person;
wherein the second device is in magnetic communication with the second magnet to generate a second signal; and
wherein the hardware processor is further configured to:
receive the second signal;
apply the second signal to a second predetermined mathematical model to generate a second indicator representative of a movement or position of the third body part;
compare the second indicator with a second database having a plurality of entries, wherein the plurality of entries of the second database are created by machine learning based on predetermined movements or positions of the third body part;
determine whether the second indicator matches at least one entry of the second database; and
based on a determination that the second indicator matches no entry of the second database, generate a second alarm signal.

3. The system according to claim 2, wherein:
the first body part is a first hand of the person and the first device is attached to the first hand of the person, wherein the first device is selected from a group consisting of a button, a ring, a glove and a wrist band;
the second body part is a second hand the person and the second device comprises a smart watch attached to the second hand of the person; and
the third body part is the head of the person and the third device is attached to the head of the person, wherein the third device is selected from a group consisting of a pair of eyeglasses, a head band, an earphone, an ear clip and a hat.

4. The system according to claim 3, wherein:
the machine includes a vehicle having a steering wheel operated by both the first hand and the second hand of the person;
the plurality of entries of the first database are created by machine learning based on historical movements and positions of the first hand of the person when the vehicle is being operated by the person; and
the plurality of entries of the second database are created by machine learning based on historical movements and positions of the head of the person when the vehicle is being operated by the person.

5. The system according to claim 4, wherein the first predetermined mathematical model comprises:
a position detection model using one or more Kalman filters for tracking positions of the first hand; and a motion detection model using one or more Kalman filters for tracking movements of the first hand, wherein the movements of the first hand are constrained within a circle defined by the steering wheel of the vehicle.

6. The system according to claim 5, wherein the second predetermined mathematical model comprises a motion detection model using one or more Kalman filters for tracking movements of the head.

7. The system according to claim 6, wherein the movements of the head tracked by the motion detection model comprises left-turning, right-turning and nodding.

8. The system according to claim 7, wherein the first predetermined mathematical model and the second predetermined mathematical model are integrated to track the positions of the first hand, the movements of the first hand, and the movements of the head simultaneously.

9. A method for monitoring and analyzing activities of a person operating a machine, wherein a first device comprising a first magnet is attached to a first body part of the person and a second device is attached to a second body part of the person, wherein the second device comprises a magnetometer in magnetic communication with the first magnet to generate a first signal, the method comprising:
receiving the first signal;
applying the first signal to a first predetermined mathematical model to generate a first indicator representative of a movement or a position of the first body part;
comparing the first indicator with a first database having a plurality of entries, wherein the plurality of entries of the first database are created by machine learning based on predetermined movements or positions of the first body part;
determining whether the first indicator matches at least one entry of the first database; and
based on a determination that the first indicator matches no entry of the first database, generating a first alarm signal.

10. The method according to claim 9,
wherein a third device comprising a second magnet is attached to a third body part of the person, and the magnetometer of the second device is in magnetic communication with the second magnet to generate a second signal; and
further comprising:
receiving the second signal;
applying the second signal to a second predetermined mathematical model to generate a second indicator representative of a movement or position of the third body part;
comparing the second indicator with a second database having a plurality of entries, wherein the plurality of entries of the second database are created by machine learning based on predetermined movements or positions of the third body part;
determining whether the second indicator matches at least one entry of the second database; and
based on a determination that the second indicator matches no entry of the second database, generating a second alarm signal.

11. The method according to claim 10, wherein:
the first body part is a first hand of the person and the first device is attached to the first hand of the person, wherein the first device is selected from a group consisting of a button, a ring, a glove and a wrist band;
the second body part is a second hand the person and the second device comprises a smart watch attached to the second hand of the person; and
the third body part is the head of the person and the third device is attached to the head of the person, wherein the third device is selected from a group consisting of a pair of eyeglasses, a head band, an earphone, an ear clip and a hat.

12. The method according to claim 11, wherein:
the machine includes a vehicle having a steering wheel operated by both the first hand and the second hand of the person;
the plurality of entries of the first database are created by machine learning based on historical movements and positions of the first hand of the person when the vehicle is being operated by the person; and
the plurality of entries of the second database are created by machine learning based on historical movements and positions of the head of the person when the vehicle is being operated by the person.

13. The method according to claim 12, wherein the first predetermined mathematical model comprises:
a position detection model using one or more Kalman filters for tracking positions of the first hand; and
a motion detection model using one or more Kalman filters for tracking movements of the first hand, wherein the movements of the first hand are constrained within a circle defined by the steering wheel of the vehicle.

14. The method according to claim 13, wherein the second predetermined mathematical model comprises a motion detection model using one or more Kalman filters for tracking movements of the head.

15. The method according to claim 14, wherein the movements of the head tracked by the motion detection model comprises left-turning, right-turning and nodding.

16. The method according to claim 15, wherein the first predetermined mathematical model and the second predetermined mathematical model are integrated to track the positions of the first hand, the movements of the first hand, and the movements of the head simultaneously.

17. A non-transitory computer program product for use with a computer, the computer program product comprising a computer readable storage medium having recorded thereon a computer-executable program for causing the computer to perform a process of monitoring and analyzing activities of a person operating a machine, wherein a first device comprising a first magnet is attached to a first body part of the person and a second device is attached to a second body part of the person, wherein the second device comprises a magnetometer in magnetic communication with the first magnet to generate a first signal, the process comprising:
receiving the first signal;
applying the first signal to a first predetermined mathematical model to generate a first indicator representative of a movement or a position of the first body part;
comparing the first indicator with a first database having a plurality of entries, wherein the plurality of entries of the first database are created by machine learning based on predetermined movements or positions of the first body part;
determining whether the first indicator matches at least one entry of the first database; and
based on a determination that the first indicator matches no entry of the first database, generating a first alarm signal.

18. The non-transitory computer program product according to claim 17,
wherein a third device comprising a second magnet is attached to a third body part of the person, and the magnetometer of the second device is in magnetic communication with the second magnet to generate a second signal; and wherein the process further comprising:

receiving the second signal;

applying the second signal to a second predetermined mathematical model to generate a second indicator representative of a movement or position of the third body part;

comparing the second indicator with a second database having a plurality of entries, wherein the plurality of entries of the second database are created by machine learning based on predetermined movements or positions of the third body part;

determining whether the second indicator matches at least one entry of the second database; and based on a determination that the second indicator matches no entry of the second database, generating a second alarm signal.

* * * * *